US 6,717,184 B2

(12) United States Patent
Taninaka et al.

(10) Patent No.: US 6,717,184 B2
(45) Date of Patent: Apr. 6, 2004

(54) LIGHT-EMITTING ELEMENT ARRAY HAVING AN ELEMENT SEPARATING REGION

(75) Inventors: Masumi Taninaka, Hachioji (JP);
Masaharu Nobori, Hachioji (JP);
Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/253,730

(22) Filed: Sep. 23, 2002

(65) Prior Publication Data
US 2003/0057509 A1 Mar. 27, 2003

(30) Foreign Application Priority Data
Sep. 21, 2001 (JP) .................................. 2001-288642

(51) Int. Cl.[7] .............................................. H01L 27/15
(52) U.S. Cl. ............................. 257/93; 257/91; 257/99
(58) Field of Search ................... 257/79–103; 362/800

(56) References Cited
U.S. PATENT DOCUMENTS 5,955,747 A * 9/1999 Ogihara et al. .............. 257/88
6,388,696 B1 * 5/2002 Taninaka et al. ............ 347/238

FOREIGN PATENT DOCUMENTS
JP    2000022206 A * 1/2000 ........... H01L/33/00

* cited by examiner

Primary Examiner—Wael Fahmy
Assistant Examiner—Marcos D. Pizarro-Crespo
(74) Attorney, Agent, or Firm—Akin Gump Strauss Hauer & Feld, LLP

(57) ABSTRACT

A light-emitting array can be driven by a matrix-type driving operation. When the packaging density of light-emitting elements is to be increased, the width of the element-separating region should be made narrower. The element-separating region extends over a considerable distance and therefore is apt to be adversely affected by particles. This tends to prevent formation of a good element-separating region, lowering manufacturing yield. An n-side electrode is arranged close to a predetermined number of LEDs. An element-separating region is formed to surround the LEDs and the n-side electrode, thereby defining a plurality of n-type semiconductor blocks. The element-separating region has a first portion that extends in a direction parallel to the line of the LEDs aligned and a second portion that extend between adjacent blocks. The first portion is wider than the second portion.

11 Claims, 6 Drawing Sheets

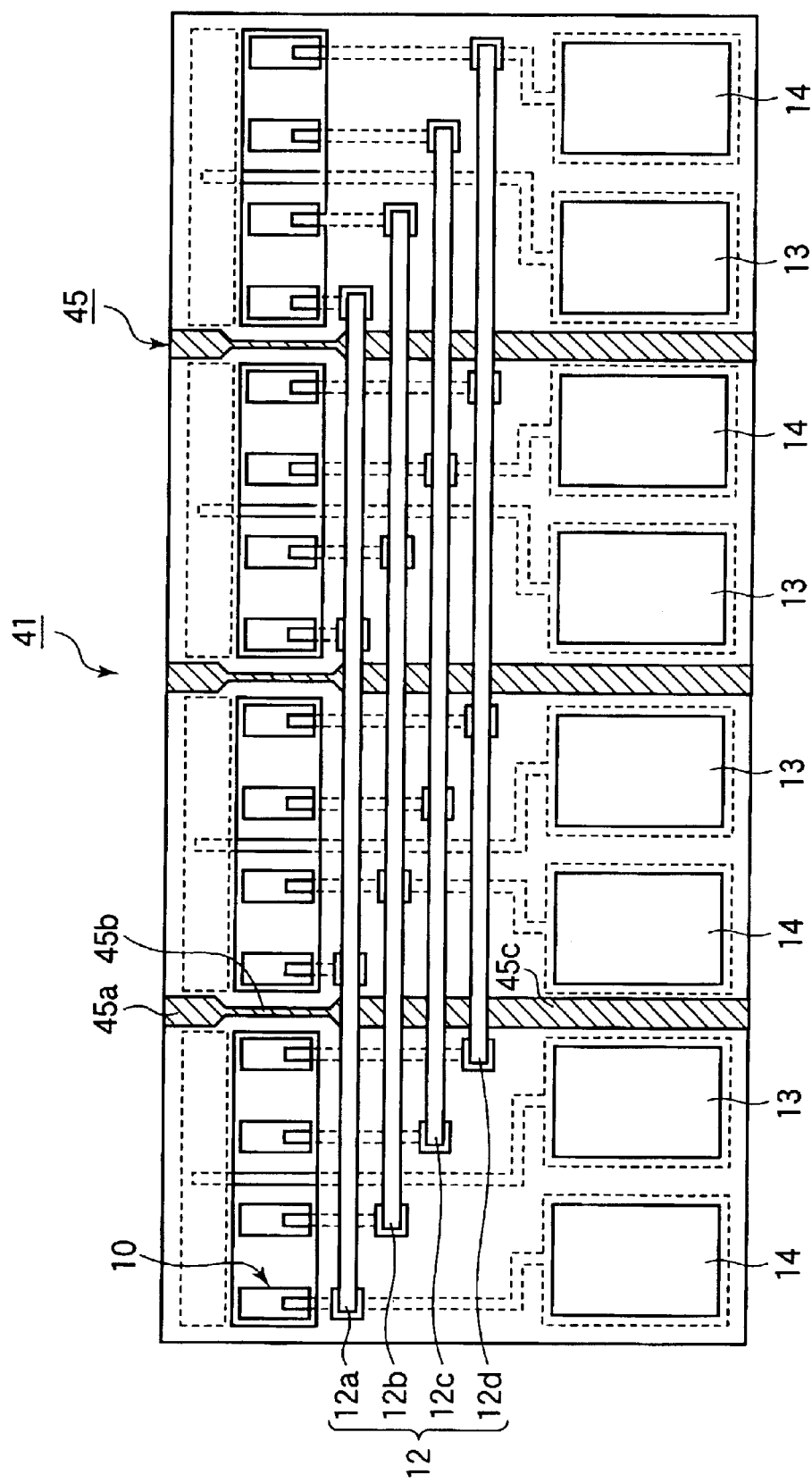

LIGHT-EMITTING ELEMENT ARRAY HAVING AN ELEMENT SEPARATING REGION

BACKGROUND OF THE INVENTION

1. Field of the Invention

The present invention generally relates to a light-emitting element array having an element-separating structure in which a semiconductor layer formed on a substrate is divided into a plurality of regions (element regions).

2. Description of Related Art

An array of light-emitting elements is a device in which a plurality of light-emitting elements is arranged in a line at equal intervals. An LED array is one such array of light-emitting elements and employs LEDs (light-emitting diodes) as a light-emitting element. An LED array is used as a light source in an optical printer that is based on electrophotography.

FIG. 6 illustrates a pertinent portion of a conventional LED array.

Referring to FIG. 6, an LED array 110 employs a matrix type wiring arrangement that reduces the number of electrode pads. The matrix wiring type LED array 110 is of the structure in which a high resistance substrate is divided electrically into M blocks by forming an element-separating region 111 and a p-type impurity is then diffused to form N LEDs 112 in each of the M blocks. The LED includes a p-type semiconductor diffusion region and corresponds to a light-emitting portion.

Each LED 112 is connected to a p-side electrode 113 and an n-side electrode 114. The n-side electrode 114 is common to all LEDs 112 in a corresponding one of M blocks. The p-side electrodes 113 in one of the M blocks are connected to corresponding p-side electrodes 113 in the other of the M blocks through corresponding ones of common wires 115. A p-side electrode pad 116 formed in each block is connected to a corresponding one of the common wires 115. An n-side electrode 114 in each block is connected to an n-side electrode pad 117 in the same block.

Thus, with the matrix wiring type LED array 110 of the aforementioned configuration, current is supplied to a desired LED in each block through the n-side electrode 117 and a corresponding p-side electrode 116, thereby energizing the desired LED.

With the aforementioned conventional matrix wiring type LED array 110, an element-separating region 111 has a certain width and extends straight across the width of the LED array 110. If the packing density of an LED array is to be increased, the distance between light-emitting portions (LED) requires to be shortened and therefore the width of the element-separating region 111 requires to be narrowed. In addition, the element-separating region 111 is quite long. Thus, merely increasing the density of conventional matrix wiring type LED array 110 increases the chance of the element-separating region ill being affected by particles 118 which are foreign materials produced during the manufacturing processes of semiconductor or entered from somewhere else. Particles 118 cause poor insulation between elements and are detrimental to pattern formation using a mask.

In other words, as shown in FIG. 6, when the width of the element-separating region 111 becomes very narrow, particles entering into the element-separating region connect electrically the adjacent blocks, being detrimental to the formation of good element-separating region as well as decreasing the manufacturing yield of array chips.

SUMMARY OF THE INVENTION

An object of the invention is to provide a light-emitting element array having an element-separating structure that can be manufactured with an increased density of light-emitting portions while also maintaining high chip yield.

A light-emitting array has a plurality of semiconductor diffusion regions aligned on a substrate. The semiconductor diffusion regions are formed in a semiconductor layer formed on the substrate by diffusing an impurity. The array includes the semiconductor layer of a first conductivity type and a predetermined number of semiconductor diffusion regions of a second conductivity type by diffusing the impurity. The array has an element-separating region that defines semiconductor blocks electrically isolated from one another, and the first conductive electrode formed in each of the semiconductor blocks. The substrate is made of a material that the plurality of semiconductor blocks can be electrically isolated. The element-separating region has a narrow portion only over a short distance.

BRIEF DESCRIPTION OF THE DRAWINGS

FIG. 5 is a top view of a pertinent portion, illustrating the configuration of a light-emitting element array according to a fourth embodiment of the invention.

DETAILED DESCRIPTION OF THE INVENTION

First Embodiment

Figure 1:
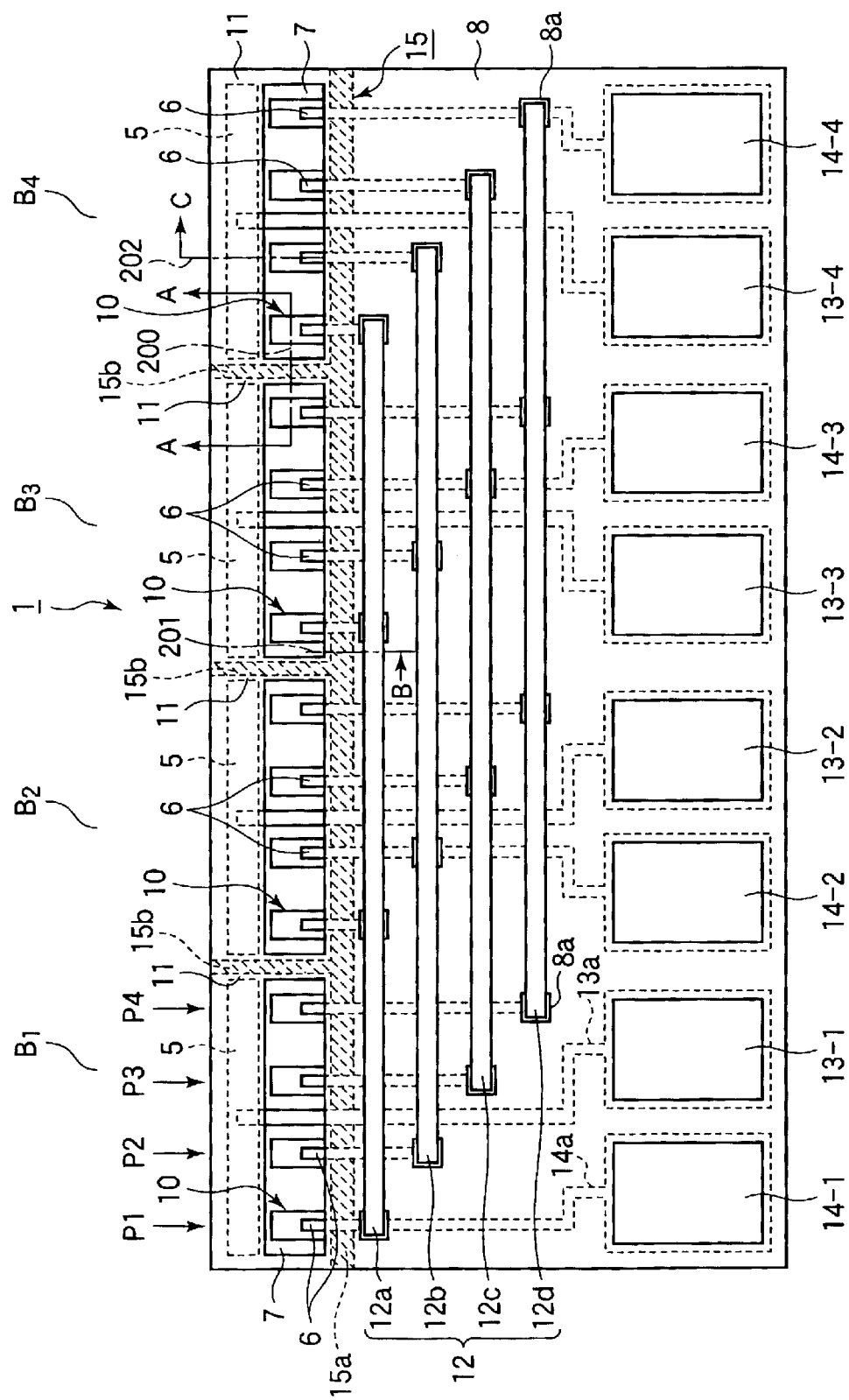
FIG. 1 is a top view, illustrating the configuration of a light-emitting element array according to a first embodiment of the invention.

FIG. 1 is a top view of a pertinent portion, illustrating the configuration of a light-emitting element array according to a first embodiment of the invention.

Figure 2A:
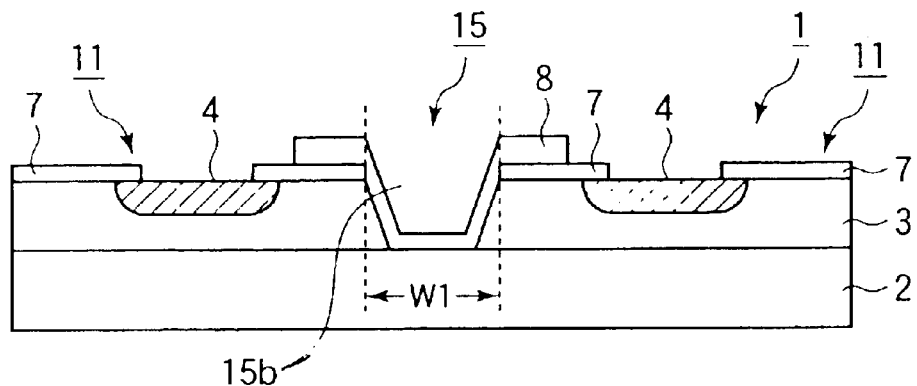
FIG. 2A is a cross-sectional view including a line 200 in FIG. 1, taken along the line A—A of FIG. 1.

FIG. 2A is a cross-sectional view including a line 200 in FIG. 1, taken along the line A—A of FIG. 1.

Figure 2B:
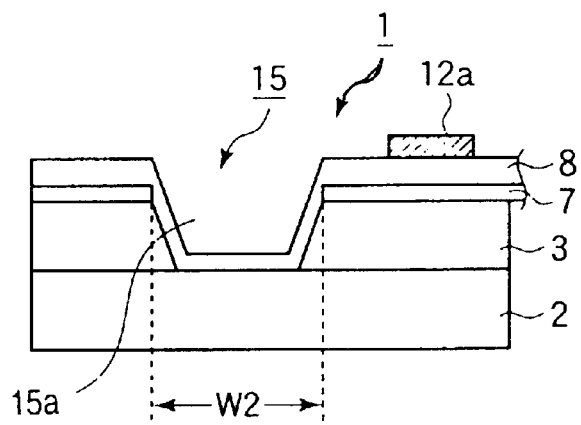
FIG. 2B is a cross-sectional view including a line 201 in FIG. 1, as seen in a direction shown by arrow B.

FIG. 2B is a cross-sectional view including a line 201 in FIG. 1, as seen in a direction shown by arrow B.

Figure 2C:
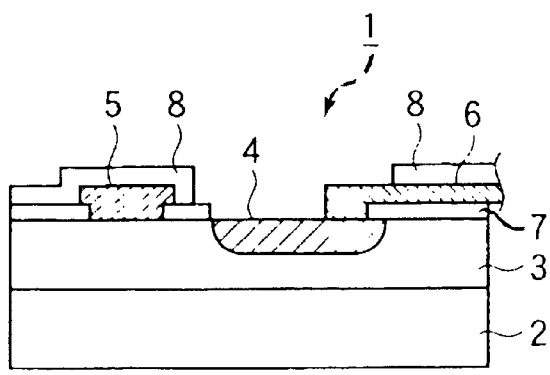
FIG. 2C is a cross-sectional view including a line 202 in FIG. 1, as seen in a direction shown by arrow C.

FIG. 2C is a cross-sectional view including a line 202 in FIG. 1, as seen in a direction shown by arrow C.

As shown in FIGS. 2A, 2B, and 2C, the light-emitting element array 1 has a semiconductor layer 3 of a first conductivity type formed on, for example, a high resistance substrate 2. Then, an impurity of a second conductivity type is diffused into the semiconductor layer 3 by solid phase diffusion, thereby forming a semiconductor diffusion region 4 of a second conductivity type.

As shown in FIG. 2C, a first interlayer dielectric film 7 is formed on the semiconductor layer 3 on the first conductivity type layer and has an opening formed therein through which a first conductive side electrode 5 makes ohmic contact with the semiconductor layer 3. Likewise, the first interlayer dielectric film 7 is formed on the semiconductor diffusion region 4 of the second conductivity type and has an opening formed therein through which a second conductive side electrode 6 makes ohmic contact with the semiconductor diffusion region 4. The high resistance substrate 2 is, for example, GaAs.

The following description assumes that the first conductivity type is an n-type semiconductor and the second conductivity type is a p-type semiconductor. The semiconductor layer 3 of the first conductivity type is, for example, an n-type $Al_tGa_{1-t}As$ (t is in the range of 0<t<1) and the impurity of the second conductivity type is, for example, Zn. Reference numeral LED 10 denotes portions associated with light-emitting operation including the p-type semiconductor diffusion region 4.

As described above, LED array 1 shown in FIG. 1 has a plurality of LEDs 10 that are aligned at a certain intervals in a longitudinal direction of the LED array 1. Each of the LEDs 10 has an n-side electrode and a p-side electrode. The n-side electrode 5 is formed as an electrode common to N LEDs successively formed. In this embodiment, N is selected to be four but can be any value depending on semiconductor process.

An n-type semiconductor block 11 includes N LEDs 10 and the n-side electrode 5. An element-separating region 15 is a groove formed around each of n-type semiconductor blocks 11 by etching, so that each n-type semiconductor block 11 is electrically isolated from the other n-type semiconductor blocks 11.

In the first embodiment, as shown in FIG. 1, the plurality of LEDs 10 are located close to one of two long sides. The element-separating region 15 includes a parallel separating region 15a and adjacent LEDs separating region 15b. The region 15a extends in a direction parallel to the long sides of the LED array 1 so that the respective LEDs are sandwiched between the region 15a and the long side of the LED array 1. The region 15a extends to reach opposed short sides of the LED array 1. The region 15b extends from the region 15a to the long side of the LED array 1, thereby isolate adjacent blocks. As mentioned above, the short sides and long side of the LED array 1 are used as a part of the element-separating region 15, eliminating the need for the element-separating region 15 to surround the entire periphery of the n-type semiconductor block 11.

As shown in FIG. 2A, the element-separating region 15 is formed as far as the high resistance substrate 2 or further into the high resistance substrate 2, thereby electrically isolating the n-type semiconductor blocks 11.

As described above, the LED array 1 shown in FIG. 1 includes M (M=4 in the first embodiment) n-type semiconductor blocks 11 aligned in a line. There are provided four common wires 12a–12d such that the p-side electrode 6 of each n-type semiconductor block is connected through a corresponding common wire 12a–12d to corresponding p-side electrodes 6 of the other semiconductor blocks. For example, it is assumed that LEDs 10 of each block are located at positions P1, P2, P3, and P4 as shown in FIG. 1. The common wire 12a is connected to LEDs 10 at position P1 of the respective blocks. The common wire 12b is connected to LEDs 10 at position P2 of the respective blocks. The common wire 12c is connected to LEDs 10 at position P3 of the respective blocks. The common wire 12d is connected to LEDs 10 at position P4 of the respective blocks.

An interlayer dielectric film 8 is formed between the respective p-side electrodes 6 and the common wires 12. Electrical connection between the p-side electrodes 6 and the corresponding common wires 12 is made through openings 8a formed in the interlayer dielectric film 8.

Each block 11 includes a p-side electrode pad 14 and an n-side electrode pad 13. The n-side electrode pad 13 is connected through an n-side electrode wire 13a to the n-side electrode 5 of a corresponding block 11. The p-side electrode pad 14 of each block is connected through a p-side electrode wire 14a to a corresponding one of the common wires 12a–12d.

As shown in FIGS. 2A and 2B, the region 15b has a width W1 and the region 15a has a width W2 greater than W1. In the present embodiment, W1 is in the range of 3 to 7 μm and W2 is in the range of 6 to 14 μm so that the ratio of W2 to W1 is about 2. This is so designed for the following reasons. The width W1 of the region 15b is directly limited by a spacing between adjacent LEDs 10 while the region 15a is not limited by the spacing. Thus, the width W2 is selected larger than the width W1, thereby preventing adverse effects of particles 118. The width W2 may be selected taking into account the class of a clean room in which the light-emitting element array is manufactured and distribution of size of particles. For example, there are four 6-μmφ particles per one cubic feet in a Class 1000 clean room. Thus, ion order to prevent detrimental effects of the particles, the region 15b should have a larger width than the diameter of the particle. The larger the width of the region 15b, the less the detrimental effect of the particles. However, a larger width leads to a larger overall size of the light-emitting element array. Thus, the maximum value of the width W2 may be selected taking into account the yield of the array due to particles and the overall area of the array.

The grooves of the regions 15a and 15b may be filled with an insulation layer such as a glass layer or a resin layer.

The aforementioned matrix-wired light-emitting element array 1 is operated as follows: When the LED 10 at position P3 in the left most n-type semiconductor block 11 is to be energized, a voltage is applied across the p-side electrode pad 14-3 and the n-side electrode pad 13-1 so that a current flows through the LED 10 at position P3. Likewise, any of the LEDs 10 can be selectively energized.

As described above, the light-emitting element array is configured such that one common n-side electrode 5 and M p-type semiconductor diffusion regions 4 are formed close to each other, and the element-separating region 15 is formed to surround the n-side electrode 5 and the p-type semiconductor diffusion region 4. Therefore, it is only the region 15b must be narrow to isolate adjacent LEDs 10. In addition, the overall length of the element-separating region 15 can be shorter with the result that the defect rate resulting from particles can be reduced and the density of light-emitting portions can be high while still maintaining good array yield.

In the first embodiment, the region 15b of the element-separating region 15 extends to reach the side edge of the light-emitting array 1, eliminating the need for fabricating a closed element-separating region to electrically isolate each n-type semiconductor block from adjacent n-type semiconductor blocks. This results in a minimum overall length of the element-separating region.

At least common wires 12a–12d are not formed over the element-separating region 15, eliminating the chance of the wires 12a–12d being breaking due to surrounding bumps and dips.

Second Embodiment

Figure 3A:
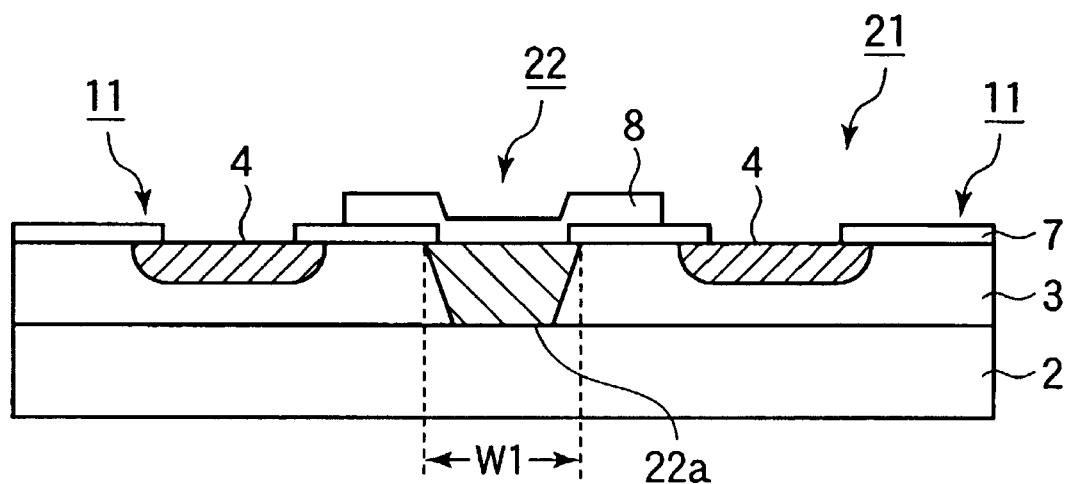
FIG. 3A is a cross-sectional view including the line 200 in FIG. 1 of a light-emitting element array according to a second embodiment, taken along line A—A.
Figure 3B:
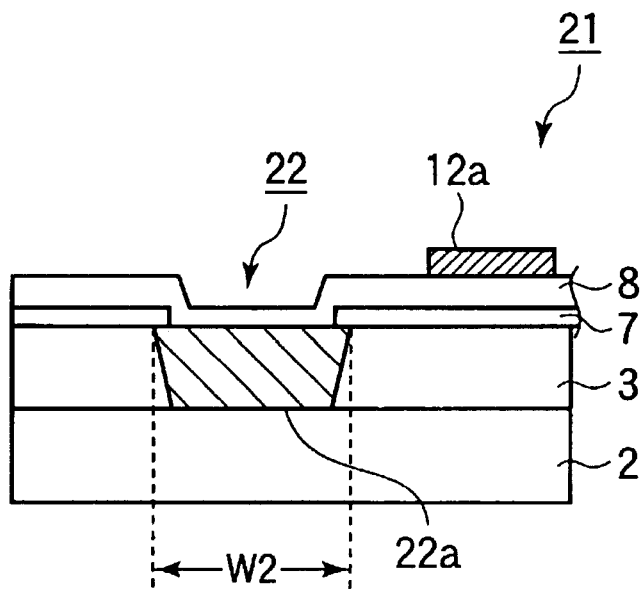
FIG. 3B is a cross-sectional view including the line 201 in FIG. 1 of a light-emitting element array according to the second embodiment, as seen in a direction shown by arrow B.

The light-emitting element array according to a second embodiment differs from the light-emitting element array 1 according to the first embodiment in the configuration of element-separating region. The second embodiment will be described with reference to FIGS. 3A and 3B and FIG. 1 that illustrates the first embodiment. FIG. 3A is a cross-sectional view including the line 200 in FIG. 1, taken along line A—A. FIG. 3B is a cross-sectional view including the line 201 in FIG. 1. The light-emitting element array 21 according to the second embodiment shown in FIGS. 3A and 3B differs from the light-emitting element array shown in FIG. 1 in that the element-separating region 22 is not an etched groove but a diffused region. Thus, elements that are the same as or corresponding to those in FIG. 1 have been given the same reference numerals, and the description thereof is omitted and only parts different from the first embodiment will be described. The diffusion region of the element-separating region 22 is formed as a p-type semiconductor diffusion region by diffusing Zn (p-type impurity) just as in the p-type semiconductor region 4. The diffusion front 22a of the diffusion region is formed as far as the high resistance substrate 2. The aforementioned configuration allows sufficient electrical isolation between n-type semiconductor blocks 11 of the light-emitting element array 21. Therefore, the light-emitting element array 21, which has the same matrix-type wiring as the light-emitting element array 1 according to the first embodiment, allows selective energizing of the LED 10. The operation of energizing the LED 10 is the same as the first embodiment and the description thereof is omitted.

As mentioned above, the light-emitting element array according to the second embodiment provides the same advantages as the first embodiment. In addition, the portion under all the wires is a planar structure with no bumps and dips. Therefore, the wires are difficult to break, providing a reliable element-separating structure.

Third Embodiment

Figure 4A:
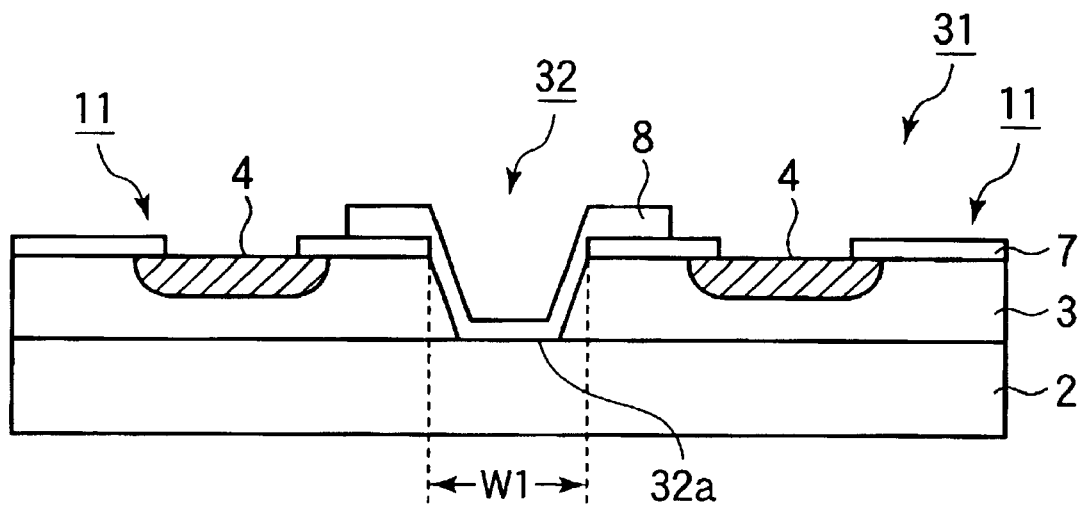
FIG. 4A is a cross-sectional view including a line 200 in FIG. 1 of a light-emitting element array according to a third embodiment, taken along line A—A.
Figure 4B:
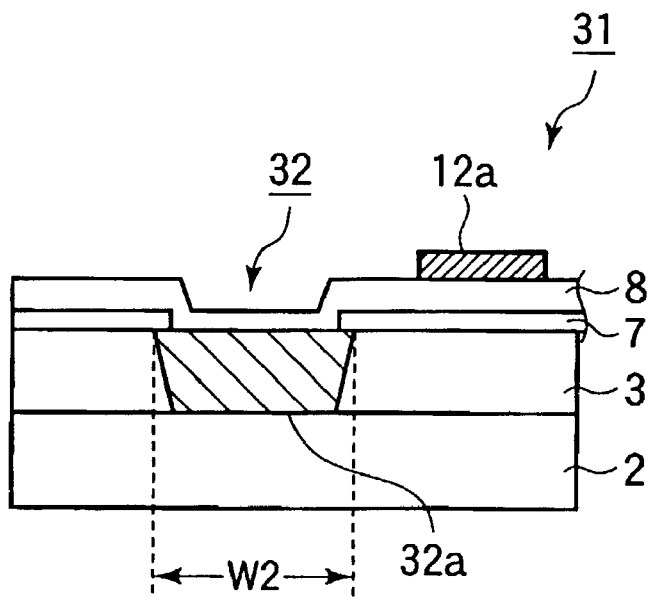
FIG. 4B is a cross-sectional view including the line 201 in FIG. 1 of a light-emitting element array according to the third embodiment, as seen in a direction shown by arrow B.
Figure 6:
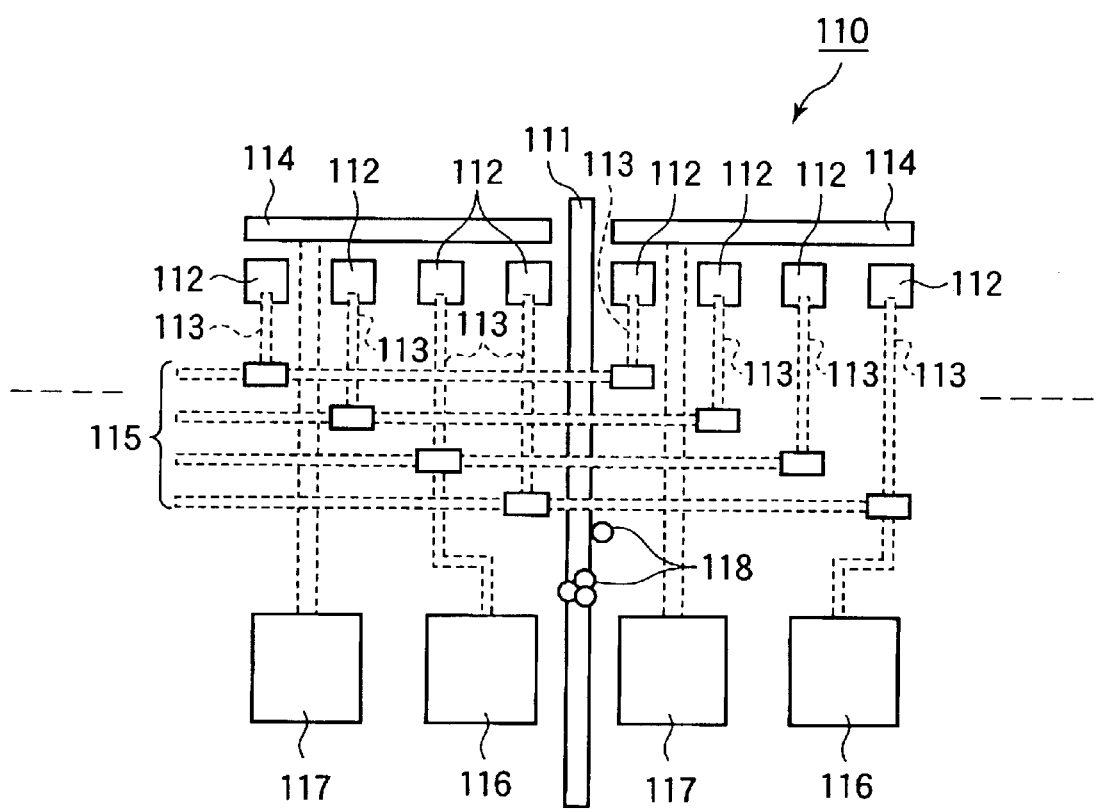
FIG. 6 illustrates a configuration of a pertinent portion of the fourth embodiment, illustrating a conventional LED array.

FIG. 4A is a cross-sectional view including the line 200 taken along line A—A of FIG. 1. FIG. 4B is a cross-sectional view including the line 201 as seen from arrow B. The light-emitting element array 31 according to the third embodiment in FIGS. 4A and 4B differs from the light-emitting array 1 according to the first embodiment in that a part of an element-separating region 32 is not an etched groove but a diffused region 32. Thus, the third embodiment will be described with reference to FIGS. 4A and 4B and FIG. 1.

The element-separating region 32 has an etched region W1 (FIG. 4A) formed between adjacent LEDs 10 and a diffused region W2 (FIG. 4B) formed along the line of LEDs. Just as the p-type semiconductor region 4, the diffused region is a p-type semiconductor region formed by diffusing Zn (p-type impurity). The diffused region W2 is formed as far as the diffusion front 32a reaches the high resistance substrate 2. Forming the element-separating region 32 as mentioned above provides sufficient electrical isolation between adjacent n-type semiconductor blocks 11. Thus, the light-emitting element array 31, which has the same matrix-type wiring as the light-emitting element array 1 according to the first embodiment, allows selective energizing of the LED 37. The operation of energizing the LED 37 is the same as the first embodiment and the description thereof is omitted.

As mentioned above, the light-emitting element array according to the third embodiment provides the same advantages as the first embodiment. In addition, the portion under all the wires is a planar structure with no bumps and dips. Therefore, the wires are difficult to break, providing a reliable element-separating structure.

Fourth Embodiment

FIG. 5 is a cross-sectional view of a pertinent portion of a light-emitting element array according to a fourth embodiment. The light-emitting element array 41 according to the fourth embodiment in FIG. 5 differs from the light-emitting array 1 according to the first embodiment in that the shape an element-separating region 45 is different from that of the first embodiment. Thus, elements that are the same as or corresponding to those in FIG. 1 have been given the same reference numerals, and the description thereof is omitted and only portions different from the first embodiment will be described.

As shown in FIG. 5, an element-separating region 45 includes three parts: element separating regions 45a, 45b, and 45c. The region 45b is formed between adjacent LEDs 10 of adjacent blocks. The region 45a and 45c are not formed between adjacent LEDs 10 but beside the line of the LEDs 10. The region 45b is narrower than the region 45a and 45c. Therefore, only the region 45b whose width is strictly limited by the proximity of adjacent LEDs 10 occupies a small portion of the overall area of the element-separating region 45.

As described above, the light-emitting element array according to the fourth embodiment has a narrow region over a very short distance across the line of the LEDs 10. This reduces the chance of poor insulation effect of the element-separating region 45 resulting from particles. In addition, an element-separating region does not require to be formed between the LEDs and electrode pads. This provides a miniaturized light-emitting element array with high yield and a short dimension across the line of LEDs 10 while also allowing a higher packaging density of light-emitting portions.

In the aforementioned embodiments, the element-separating region for defining the respective n-type semiconductor blocks extends to reach the side edge of the light-emitting element array 1. Therefore, the respective n-type semiconductor blocks can be electrically isolated from each other even if the element-separating region does not surround each block all around it. The invention is not limited to these embodiments, and the element-separating region may be formed all around each n-type semiconductor block.

The aforementioned embodiments employed a high resistance substrate of, for example, GaAs but are not limited to this. The substrate may be made of a semi-insulating semiconductor or a semiconductor of a conductivity type opposite to an n-type semiconductor block, e.g., p-type GaAs, which still allows electrical isolation between n-type semiconductor blocks. In addition, a p-type semiconductor layer may be formed between the n-type semiconductor block and the substrate, so that the substrate can be a semiconductor of the same conductivity type as the n-type semiconductor block.

The aforementioned embodiments assumed that the first conductivity type is an n-type semiconductor and the second conductivity type is a p-type semiconductor. Instead, the first conductivity type may be a p-type semiconductor and the second conductivity type may be an n-type semiconductor.

In the aforementioned embodiments, a single semiconductor layer is formed on the substrate but the invention is not limited to this configuration. A plurality of semiconductor layers having a single heterojunction structure or a double heterojunction structure may be formed on the substrate.

The aforementioned embodiments employed solid phase diffusion for diffusing an impurity (Zn) in the light emitting portion but the invention is not limited to this diffusion technique. Various diffusion techniques such as vapor phase diffusion and ion implantation may be employed.

In the second and third embodiments, the element-separating region is formed by diffusing Zn which is a p-type impurity. The diffusion process for forming the element-separating region only needs to be formed deep without having to consider any conditions such as those required in forming light-emitting portions. Therefore, for example, carbon may be diffused as an impurity. The element-separating region need not be diffused by the same diffusion technique as the light-emitting portion. In fact, the element-separating region may be formed in a variety of manners. For example, when the light-emitting portion is diffused by, for example, solid phase diffusion, the element-separating region may be formed deeper than the light-emitting portion by another diffusion technique such as vapor phase diffusion or ion implantation.

What is claimed is:

1. A light-emitting array having opposed long sides and opposed short sides and a plurality of semiconductor diffusion regions formed in a semiconductor layer by diffusing an impurity, comprising:

an element-separating region, defining semiconductor blocks chat are electrically isolated front one another, each of the semiconductor blocks including a predetermined number of the plurality or semiconductor diffusion regions; and a common electrode formed in each of the semiconductor blocks and connected to the semiconductor layer;

wherein said element-separating region includes a first separating region and a second separating region, the first separating region being formed to extend so that the semiconductor diffusion regions are between said element-separating region and the long side of the light-emitting array, the first separating region extending from one of the short sides to other one of the short sides, and the second separating region being formed to extend between adjacent semiconductor blocks, the second separating region having one end reaching the first separating region and the other end reaching one of the long sides.

2. The light-emitting array according to claim 1, wherein said element-separating region is a groove.

3. The light-emitting array according to claim 1, wherein said element-separating region is a diffused region.

4. The light-emitting array according to claim 1, wherein said element-separating region is formed of a groove and a diffusion region.

5. The light-emitting array according to claim 1, wherein said plurality of semiconductor diffusion regions are formed closer in one of the long sides than the other of the long sides.

6. The light-emitting array according to claim 1, wherein the first separating region has a larger width than the second separating region.

7. The light-emitting array according to claim 1, further comprising individual electrodes each of which is connected to a corresponding one of said plurality of semiconductor regions; and a common wire that connects one of the individual electrodes in one of the semiconductor blocks to a corresponding one of the individual electrodes in the other semiconductor blocks.

8. The light-emitting array according to claim 1, wherein the semiconductor layer is formed on a substrate made of a high resistance material.

9. The light-emitting array according to claim 1, wherein the substrate is made of GaAS and the semiconductor is an AlGaAs epitaxial layer.

10. The light-emitting array according to claim 1, wherein the semiconductor layer is formed on a substrate made of a semi-insulating semiconductor.

11. The light-emitting array according to claim 1, wherein the semiconductor layer is formed on a substrate made of a semiconductor of a conductivity type opposite to the semiconductor layer.

* * * * *